United States Patent
Lindberg et al.

(10) Patent No.: US 8,428,094 B2
(45) Date of Patent: Apr. 23, 2013

(54) SURFACE-EMITTING SEMICONDUCTOR LASER

(75) Inventors: Hans Lindberg, Regensburg (DE); Stefan Illek, Donaustauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/865,841

(22) PCT Filed: Dec. 18, 2008

(86) PCT No.: PCT/DE2008/002128
§ 371 (c)(1), (2), (4) Date: Dec. 22, 2010

(87) PCT Pub. No.: WO2009/094967
PCT Pub. Date: Aug. 6, 2009

(65) Prior Publication Data
US 2011/0122911 A1 May 26, 2011

(30) Foreign Application Priority Data
Jan. 31, 2008 (DE) .......... 10 2008 006 993

(51) Int. Cl.
*H01S 3/091* (2006.01)
*H01S 5/00* (2006.01)
*H01S 3/09* (2006.01)

(52) U.S. Cl.
USPC ......... 372/75; 372/43.01; 372/50.11; 372/69; 372/70

(58) Field of Classification Search ............... 372/43.01, 372/69–70, 75
See application file for complete search history.

(56) References Cited

U.S. PATENT DOCUMENTS

| | | |
|---|---|---|
| 6,233,263 B1 | 5/2001 | Chang-Hasnain et al. |
| 6,393,038 B1 | 5/2002 | Raymond et al. |
| 6,735,234 B1 * | 5/2004 | Paschotta et al. ............... 372/75 |
| 6,947,460 B2 | 9/2005 | Spath et al. |
| 6,954,479 B2 | 10/2005 | Albrecht et al. |
| 7,522,646 B2 | 4/2009 | Brick et al. |

(Continued)

FOREIGN PATENT DOCUMENTS

| | | |
|---|---|---|
| DE | 102 60 183 | 7/2004 |
| DE | 10 2004 024 611 | 3/2005 |

(Continued)

OTHER PUBLICATIONS

G. Chen et al., "Angular filtering of spatial modes in a vertical-cavity surface-emitting laser by a Fabry-Perot etalon", Applied Physics Letters, American Institute of Physics, vol. 74, No. 8, pp. 1069-1071, Feb. 22, 1999.

*Primary Examiner* — Jessica Stultz
*Assistant Examiner* — Phillip Nguyen
(74) *Attorney, Agent, or Firm* — Cozen O'Connor

(57) ABSTRACT

A surface-emitting semiconductor laser is described, with a semiconductor chip (1), which has a substrate (2), a DBR-mirror (3) applied to the substrate (2) and an epitaxial layer sequence (4) applied to the DBR mirror (3), said layer sequence comprising a radiation-emitting active layer (5), and with an external resonator mirror (9) arranged outside the semiconductor chip (1). The DBR mirror (3) and the substrate (2) are partially transmissive for the radiation (6) emitted by the active layer (5) and the back (14) of the substrate (2) remote from the active layer (5) is reflective to the emitted radiation (6).

14 Claims, 6 Drawing Sheets

U.S. PATENT DOCUMENTS

| | | |
|---|---|---|
| 2001/0043636 A1 | 11/2001 | Bewley et al. |
| 2002/0176473 A1 | 11/2002 | Mooradian |
| 2003/0031221 A1 | 2/2003 | Wang et al. |
| 2004/0208217 A1 | 10/2004 | Brick et al. |
| 2004/0233961 A1 | 11/2004 | Lutgen |
| 2005/0259700 A1 | 11/2005 | Spath et al. |
| 2006/0054908 A1* | 3/2006 | Sai et al. .................. 257/96 |
| 2006/0140235 A1 | 6/2006 | Kim |
| 2006/0291515 A1* | 12/2006 | Kim ..................... 372/50.11 |

FOREIGN PATENT DOCUMENTS

| | | |
|---|---|---|
| EP | 1 662 584 | 5/2006 |
| WO | WO 01/93386 | 12/2001 |
| WO | WO 03/034559 | 4/2003 |
| WO | WO 2005/048424 | 5/2005 |
| WO | WO 2007/144471 | 12/2007 |

\* cited by examiner

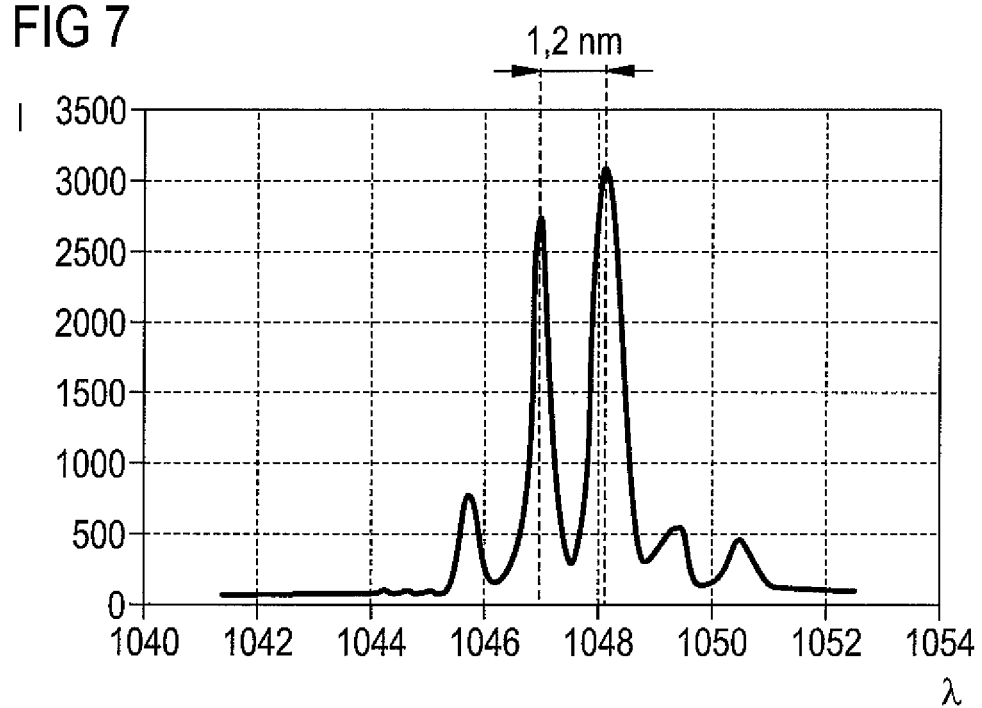
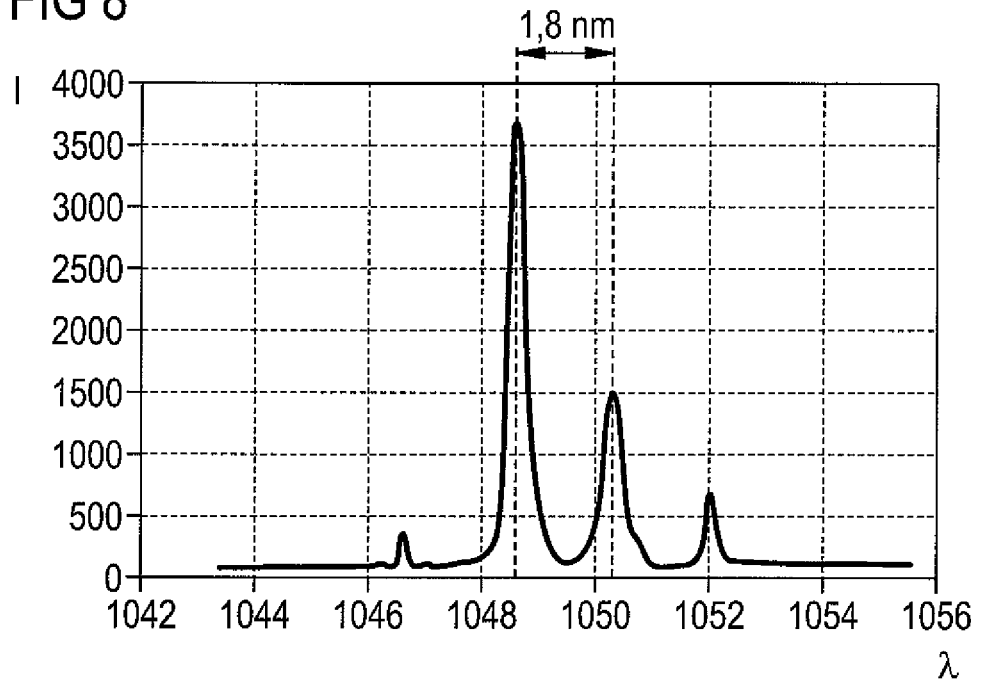

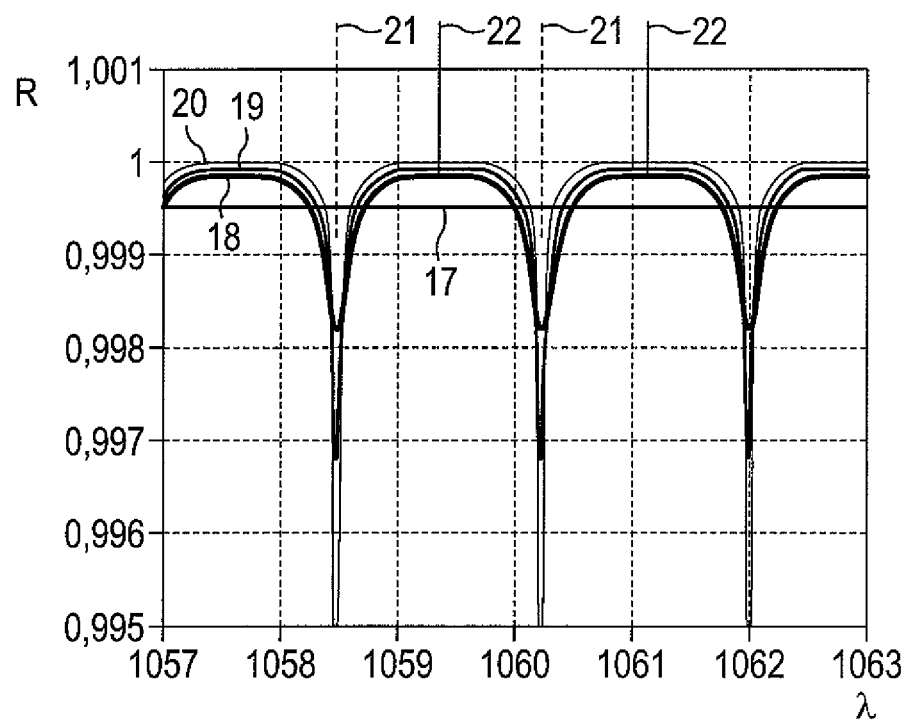

SURFACE-EMITTING SEMICONDUCTOR LASER

RELATED APPLICATIONS

This is a U.S. national stage of application No. PCT/DE2008/002128, filed on Dec. 18, 2008.

This application claims the priority of German application no. 10 2008 006 993.0 filed Jan. 31, 2008, the entire content of which is hereby incorporated by reference.

The invention relates to a surface-emitting semiconductor laser with a semiconductor chip.

BACKGROUND OF THE INVENTION

Surface-emitting semiconductor lasers with external resonators, also known as disc lasers or VECSELs (Vertical External Cavity Surface Emitting Laser), are distinguished by a high output power together with high beam quality.

Such surface-emitting semiconductor lasers offer the possibility, in particular, of integrating into the laser resonator a means for frequency conversion of the emitted radiation. In this way it is especially possible, with a semiconductor material which emits radiation in the infrared spectral range, to use frequency doubling to generate visible light, in particular in the green spectral range. Frequency conversion in this case is generally brought about by a nonlinear optical crystal. To achieve efficient frequency conversion, the semiconductor laser should display a narrow-band emission spectrum and a high optical power within the laser resonator. It is especially desirable for the semiconductor laser to emit radiation of a single longitudinal mode.

To achieve single mode operation, two transmission filters in the form of etalons are often used in the external resonator.

As a rule, a first transmission filter is used in this case which has a free spectral range of such a size that the spectral overlap with the gain curve of the active material causes only the modes of one transmission maximum to oscillate in laser operation. Jumping of the laser modes between different transmission maxima of the filter is thus prevented. However, as a rule, the transmission maximum of a transmission filter in the form of an etalon with a large free spectral range generally has such a large full width at half maximum that a plurality of longitudinal modes of the laser resonator may start to oscillate within this transmission maximum. For this reason a second transmission filter is used, in order to select an individual longitudinal mode from the longitudinal modes of the laser resonator which fall into the transmission maximum of the first filter.

However, the use of two filters requires precise adjustment of the two filters and may generate undesired optical losses in the laser resonator.

SUMMARY OF THE INVENTION

One object of the present invention is to provide a surface-emitting semiconductor laser in which frequency selection of the longitudinal modes proceeds in a comparatively simple manner, such that a second transmission filter in the form of an etalon may in particular be dispensed with.

This and other objects are attained in accordance with one aspect of the invention directed to a surface-emitting semiconductor laser that contains a semiconductor chip, which has a substrate, a DBR mirror applied to the substrate and an epitaxial layer sequence applied to the DBR mirror, which layer sequence comprises a radiation-emitting active layer. In addition, to form an external resonator the surface-emitting semiconductor laser contains an external resonator mirror arranged outside the semiconductor chip. The DBR mirror and the substrate are partially transmissive for the radiation emitted by the active layer and the back of the substrate remote from the active layer is reflective to the emitted radiation.

Because the DBR mirror and the substrate are partially transmissive for the radiation emitted by the active layer, part of the radiation emitted in the active layer may penetrate into the substrate, pass through the substrate and be reflected back towards the DBR mirror and the active layer at the rear boundary surface of the substrate remote from the active layer. In the case of the DBR mirror, only slight partial transmissivity for the radiation emitted by the active layer is sufficient; in particular the DBR mirror may display transmission of markedly less than 1%. Preferably, the transmission of the DBR mirror amounts to more than 0.1%.

The substrate enclosed between the DBR mirror and the reflective back of the substrate in this way forms a cavity whose resonant wavelength is dependent on the thickness of the substrate. At the resonant wavelength of the cavity, the radiation fraction transmitted by the partially transmissive DBR mirror towards the back of the substrate is reflected to-and-fro repeatedly in the cavity, such that comparatively high absorption losses occur in the substrate.

The cavity formed from the partially transmitting DBR mirror, the substrate and the reflective back of the substrate may be used as a wavelength-selective filter, since the longitudinal laser modes, whose wavelength corresponds to the resonant wavelengths of the cavity, cannot start to oscillate because the optical losses due to absorption in the cavity are too great.

The cavity formed from the DBR mirror, the substrate and the reflective back of the substrate may in this way replace an etalon arranged in the laser resonator, such that the manufacturing and adjustment effort for the surface-emitting semiconductor laser is advantageously reduced.

In one advantageous configuration the cavity formed by the DBR mirror and the reflective back of the substrate is anti-resonant at the wavelength λ of the radiation emitted by the active layer. In this case the following applies:

$$n*d=(m+\tfrac{1}{2})*\lambda/2.$$

Here, n is the refractive index of the substrate, d the thickness of the substrate, m an integer and λ the wavelength.

In this case the absorption losses of the radiation emitted by the active layer are minimal in the cavity formed from the DBR mirror, the substrate and the reflective back of the substrate and reflectivity is maximal. Adjacent longitudinal laser modes whose wavelengths differ from the laser wavelength on the other hand undergo greater absorption losses and in this way are advantageously suppressed.

The back of the substrate remote from the active layer is advantageously provided with a reflection-increasing layer. The reflection-increasing layer may in particular be a layer of a metal or a metal alloy. For example the reflection-increasing layer may be a layer of gold germanium (AuGe).

Preferably, the reflection of the boundary surface between the substrate and the reflection-increasing layer amounts to more than 30% for the radiation emitted by the active layer.

Reflection of some of the radiation emitted by the active layer at the back of the substrate has the advantage that the number of periods of the DBR mirror may be reduced relative to a conventional semiconductor laser. Reducing the number of layer pairs of the DBR mirror has the advantage of reducing the total thickness of the DBR mirror, so improving dissipation of the heat generated in the active layer.

The reflectivity of the DBR mirror reduced due to the smaller number of layer pairs is advantageously at least partially compensated by the reflection of the radiation at the back of the substrate, such that a high total reflection advantageous for laser operation is achieved.

The total reflection of the combination of the DBR mirror and the cavity formed with the reflective back of the substrate preferably amounts to 99.9% or more. Such high reflection of the combination of the DBR mirror and the reflective back of the substrate may be achieved in particular even when the transmission of the DBR mirror amounts to more than 0.1%. To achieve such high total reflection, a reflection-increasing layer is advantageously applied to the back of the substrate, the reflection of which layer amounts to more than 30%.

The wavelength selection achieved by means of the cavity has the advantage that in the case of the surface-emitting semiconductor laser a single etalon is advantageously sufficient as an additional transmission filter in the external resonator. Furthermore, the single etalon in the external resonator may advantageously be an inexpensively producible uncoated etalon, which preferably consists of a single homogeneous material. For example the etalon may be an uncoated glass wafer.

To dissipate the heat generated in the active layer, the surface-emitting semiconductor laser may for example be fitted onto a heat sink. The heat sink may in particular be fitted to the back of the substrate. A comparatively small number of periods of the DBR mirror in this case reduces the thermal resistance between the active layer and the heat sink.

In one configuration of the invention the substrate of the surface-emitting semiconductor layer is a GaAs substrate. A GaAs substrate is transmissive for an emission wavelength in the infrared spectral range, for example a wavelength of approx. 1060 nm, i.e. it displays only comparatively slight absorption. Depending on the emission wavelength of the surface-emitting semiconductor laser, other substrates may also be used which are at least partially transmissive for the emission wavelength, for example substrates of InP, sapphire or SiC.

The surface-emitting semiconductor laser is preferably an optically pumped semiconductor laser. In particular, the surface-emitting semiconductor laser comprises a pump radiation source arranged outside the epitaxial layer sequence. The pump radiation source may for example be a diode laser, which irradiates into the active layer pump radiation with a pump wavelength which is smaller than the emission wavelength of the radiation emitted by the active layer and in this way excites the active layer to emit laser radiation.

The active layer may in particular be a single or multiple quantum well structure. For the purposes of the application, the term "quantum well structure" includes any structure in which charge carriers undergo quantization of their energy states by confinement. In particular, the term quantum well structure does not provide any indication of the dimensionality of the quantization. It thus encompasses inter alia quantum wells, quantum wires and quantum dots and any combination of these structures.

The active layer is preferably based on a III-V compound semiconductor, in particular on an arsenide compound semiconductor. In the present context, "based on an arsenide compound semiconductor" means that the active epitaxial layer sequence or at least one layer thereof comprises an arsenide compound semiconductor material, preferably $Al_nGa_mIn_{1-n-m}As$, wherein $0 \leq n \leq 1$, $0 \leq m \leq 1$ and $n+m \leq 1$. This material does not absolutely have to exhibit a mathematically exact composition according to the above formula. Instead, it may comprise one or more dopants and additional constituents which do not substantially modify the characteristic physical properties of the $Al_nGa_mIn_{1-n-m}As$ material. For simplicity's sake, however, the above formula includes only the fundamental constituents of the crystal lattice (Al, Ga, In, As), even if these may in part be replaced by small quantities of further substances.

In a further preferred embodiment of the invention, the surface-emitting semiconductor laser comprises a pump radiation source integrated monolithically into the epitaxial layer sequence. Monolithic integration of a pump radiation source into the epitaxial layer sequence of a surface-emitting semiconductor laser is known per se from document WO 01/93386 A1 and is therefore not explained in any greater detail at this point.

The surface-emitting semiconductor laser preferably contains a frequency conversion element for frequency conversion of the radiation emitted by the active layer.

Frequency conversion may in particular be frequency multiplication, for example frequency doubling. For example, the surface-emitting semiconductor laser may comprise an active layer provided for emitting infrared radiation, the infrared radiation being converted by means of the frequency conversion element into visible light, preferably into green or blue visible light. The frequency conversion element may in particular be an optically non-linear crystal. For frequency conversion it is advantageous for wavelength selection to take place by means of the cavity formed from the DBR mirror and the reflective back of the substrate, since frequency conversion by a non-linear optical element is particularly effective where the radiation has a small spectral bandwidth, in particular in single mode operation.

BRIEF DESCRIPTION OF THE DRAWINGS

FIG. 7 is a schematic graphic representation of a measured emission spectrum of an exemplary embodiment of a surface-emitting semiconductor laser according to the invention, FIG. 8 is a schematic graphic representation of a measured emission spectrum of a further exemplary embodiment of a surface-emitting semiconductor laser according to the invention, and FIG. 9 shows schematic graphic representations of simulations of the reflectivity R of a DBR mirror on a substrate.

DETAILED DESCRIPTION OF THE DRAWINGS

Figure 1:
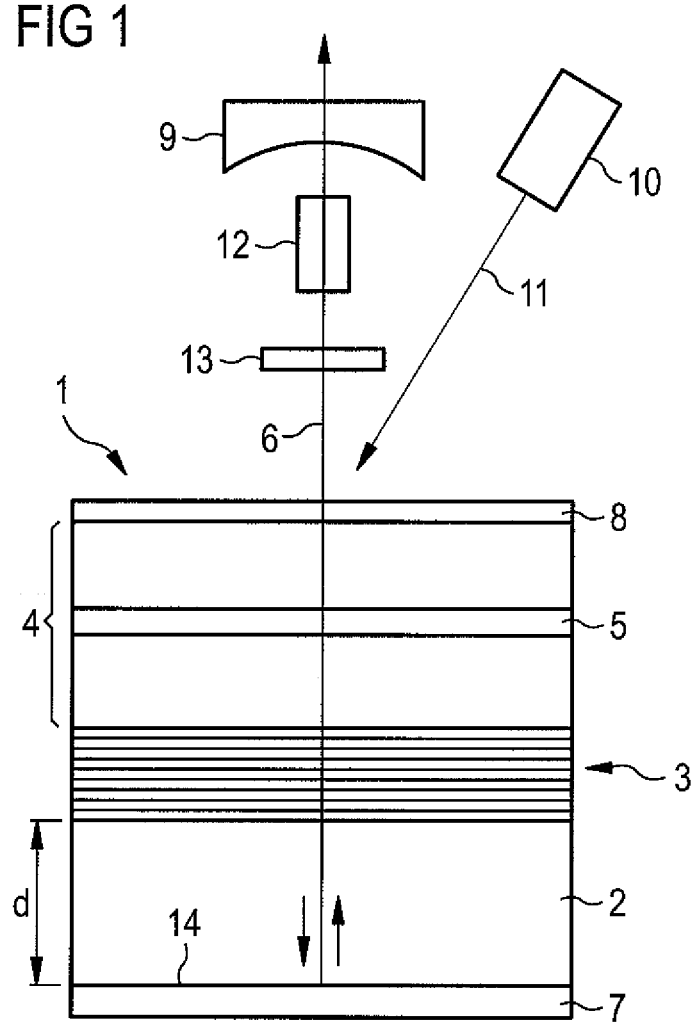
FIG. 1 is a schematic representation of a cross section through a first exemplary embodiment of a surface-emitting semiconductor laser according to the invention.

Identical or identically acting elements are provided with identical reference numerals in the Figures. The Figures should not be considered as being to scale, but rather individual elements may be shown exaggeratedly large for the sake of clarity.

The surface-emitting semiconductor laser illustrated in FIG. 1 contains a semiconductor chip 1, which comprises a substrate 2. The substrate 2 preferably comprises a GaAs substrate, which is partially transmissive for wavelengths in the infrared spectral range.

A DBR mirror 3 is applied to the substrate 2, which mirror contains a plurality of layer pairs of in each case two semiconductor layers, which differ from one another in their material composition and thus in their refractive index. The alternating layers of the DBR mirror 3 are preferably grown epitaxially onto the substrate 2.

The DBR mirror 3 is followed in the growth direction of the semiconductor chip 1 by an epitaxial layer sequence 4. The epitaxial layer sequence 4 comprises an active layer 5 suitable for emitting radiation 6, in particular radiation from the ultraviolet, visible or infrared spectral range. The active layer 5 may comprise a plurality of semiconductor layers, in particular it may contain a quantum well structure.

The active layer 5 is preferably a layer suitable for the emission of infrared radiation. In particular, the active layer 5 may be based on an arsenide compound semiconductor material. In the present context, "based on an arsenide compound semiconductor" means that the active epitaxial layer sequence or at least one layer thereof comprises an arsenide compound semiconductor material, preferably $Al_nGa_mIn_{1-n-m}As$, wherein $0 \leq n \leq 1$, $0 \leq m \leq 1$ and $n+m \leq 1$. This material does not absolutely have to exhibit a mathematically exact composition according to the above formula. Instead, it may comprise one or more dopants and additional constituents which do not substantially modify the characteristic physical properties of the $Al_nGa_mIn_{1-n-m}As$ material. For simplicity's sake, however, the above formula includes only the fundamental constituents of the crystal lattice (Al, Ga, In, As), even if these may in part be replaced by small quantities of further substances.

The surface-emitting semiconductor laser is an optically pumped semiconductor laser, in which a pump radiation source 10 arranged outside the semiconductor chip 1 irradiates pump radiation 11 into the active layer 5 of the semiconductor chip 1, in order to excite this to emit laser radiation 6.

The surface-emitting semiconductor laser comprises a laser resonator, which is formed by the DBR mirror 3 and an external resonator mirror 9 arranged outside the semiconductor chip 1. The laser radiation 6 of the surface-emitting semiconductor laser is coupled out by the external resonator mirror 9.

A frequency conversion element 12 is contained in the laser resonator of the surface-emitting semiconductor laser. The radiation emitted by the active layer 5 is converted to a greater frequency and thus to a shorter wavelength by means of the frequency conversion element 12. The frequency conversion may in particular comprise frequency doubling, such that the surface-emitting semiconductor laser emits laser radiation with a wavelength which is half as great as the radiation emitted by the active layer 5. In particular, the active layer 5 may emit infrared radiation, which is converted by means of the frequency conversion element 12 into visible radiation, in particular green or blue radiation.

Furthermore, the laser resonator preferably contains a transmission filter 13, in particular in the form of an etalon. The transmission filter 13 is preferably distinguished by a large free spectral range, in order to select a narrow wavelength range for laser emission from the comparatively wide gain range of the active layer 5. In the case of a transmission filter 13 in the form of an etalon, which comprises a large free spectral range and thus widely spaced transmission maxima, the transmission maxima are generally of such width that a plurality of longitudinal laser modes lie within the transmission range. If particularly narrow-band laser emission, in particular single mode operation is desired, in the case of conventional semiconductor lasers a second etalon is therefore generally used, which is distinguished by transmission maxima with a small half-value width, in order to select a small number of or preferably just one longitudinal laser mode within the transmission maximum of the first etalon.

In the case of the surface-emitting semiconductor laser according to the invention, the longitudinal laser modes are selected, on the other hand, in that the DBR mirror 3 and the substrate 2 are partially transmissive for the emitted radiation 6 and the back 14 of the substrate 2 remote from the active layer 5 is reflective. The radiation 6 emitted by the active layer is thus only partially reflected by the DBR mirror 3, such that a proportion of the emitted radiation 6 may pass at least partially through the DBR mirror 3 and the substrate 2. Preferably, the DBR mirror 3 displays transmission of more than 0.1%. The radiation 6 is then reflected back towards the DBR mirror 3 and the active layer 5 at the reflective back 14 of the substrate.

The back 14 of the substrate 2 is preferably provided with a reflection-increasing layer 7, which may in particular comprise a layer of a metal or a metal alloy. In particular, the reflection-increasing layer 7 may be a layer of AuGe.

Preferably, the reflection at the boundary surface between the substrate 2 and the reflection-increasing layer 7 amounts to more than 30%. Because the reflection at the back 14 of the substrate 2 amounts to more than 30%, a total reflection, advantageous for laser operation, of the combination of the DBR mirror 3 and the back 14 of the substrate 2 of more than 99.9% may be achieved. Such high total reflection may be achieved even when the DBR mirror 3 displays a transmission of more than 0.1%.

A reflection-reducing layer 8 is preferably applied onto the opposite surface of the semiconductor chip 1 from the substrate 2, in order to improve outcoupling of radiation out of the semiconductor chip.

The DBR mirror 3 and the reflective back 14 of the substrate 2 form a cavity, whose thickness d is equal to the thickness of the substrate 2. Wavelength selection of the longitudinal laser modes proceeds in that wavelengths which fulfil the resonance condition of the cavity formed from the DBR mirror 3 and the reflective back 14 of the substrate are repeatedly reflected to-and-fro in the cavity and thereby experience comparatively high absorption losses. At these wavelengths the combination of DBR mirror 3 and substrate back 14 displays a reflection minimum. In contrast, maximal reflectivity is available for wavelengths for which the cavity is antiresonant, such that a longitudinal laser mode with this wavelength may start to oscillate in the laser resonator.

Because of the mode selection achieved in this way, a single transmission filter 13 in the external resonator is advantageously sufficient in the case of the surface-emitting semiconductor laser. The transmission filter 13 may in particular be an uncoated etalon, for example in the form of an uncoated glass wafer. Manufacturing effort and the associated costs are reduced advantageously thereby.

The high reflection of the cavity formed of the DBR mirror 3 and the reflective back 14 of the substrate 2 has the additional advantage that the number of layer pairs of the DBR mirror may be comparatively small, in particular less than 25. In this way, the total thickness of the DBR mirror 3 is small, so improving dissipation of the heat generated in the active layer 5. The reflectivity of the DBR mirror 3 reduced due to the small number of layer pairs is advantageously at least partially compensated by the reflection of the radiation 6 at the back 14 of the substrate 2.

Figure 2:
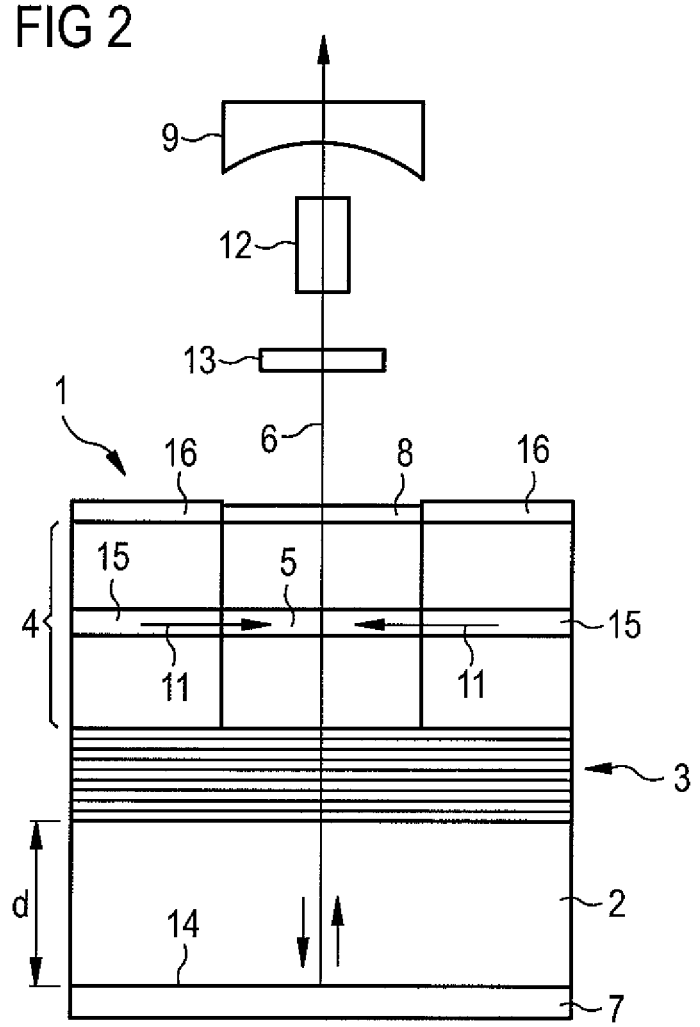
FIG. 2 is a schematic representation of a cross section through a further exemplary embodiment of a surface-emitting semiconductor laser according to the invention.

The exemplary embodiment shown in FIG. 2 of a surface-emitting semiconductor laser according to the invention differs from the exemplary embodiment shown in FIG. 1 in that instead of a pump radiation source arranged outside the semiconductor chip 1 two pump lasers 15 integrated monolithically into the semiconductor chip 1 are provided for optical pumping of the active layer 5, which pump lasers irradiate pump radiation 11 laterally into the active layer 5. As a result of the monolithically integrated pump lasers 15, effective optical pumping of the active layer 5 is achieved, it being possible to dispense with a pump laser arranged outside the semiconductor chip 1, manufacturing and adjustment effort thus being reduced.

The pump lasers 15 may for example be electrically contacted by electrical contacts 16 arranged on the surface of the semiconductor chip 1 remote from the substrate 2. A layer of a metal or a metal alloy 7 on the back 14 of the substrate 2 may for example serve as a second electrical contact and advantageously at the same time in increasing the reflection of the back 14 of the substrate 2. In other respects this exemplary embodiment of a surface-emitting semiconductor laser corresponds, in particular in terms of formation of the cavity by the partially transmissive DBR mirror 3 and the reflective back 14 of the substrate 2, to the exemplary embodiment shown in FIG. 1.

The effect of the cavity formed from the DBR mirror 3 and the back 14 of the substrate 2 on the emission spectrum of the surface-emitting semiconductor laser is explained in greater detail below with reference to FIGS. 3 to 8.

Figure 3:
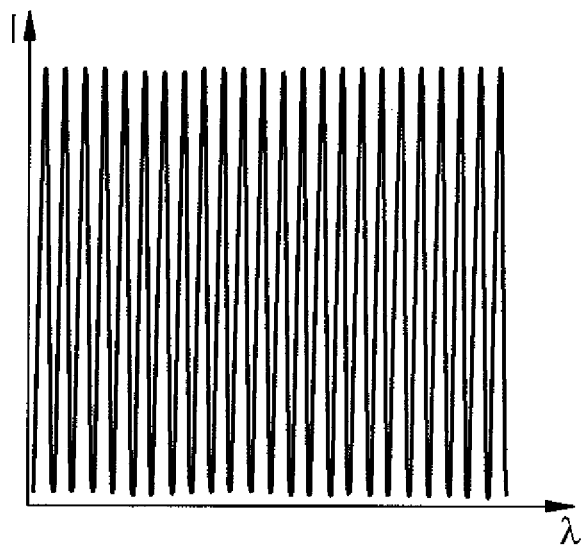
FIG. 3 is a schematic graphic representation of the longitudinal laser modes in the laser resonator which does not take account of spectral filtering.

FIG. 3 is a schematic representation of the mode spectrum of the longitudinal laser modes in a laser resonator, without the influence of one or more wavelength-selective elements. The intensity I of the laser modes is plotted as a function of wavelength $\lambda$. The spectrum of the longitudinal modes comprises a plurality of maxima and minima, whose spacing depends on the length of the laser resonator. For a laser resonator whose length amounts to approx. 5 mm, the spacing of the longitudinal laser modes amounts to approx. 0.1 nm.

Figure 4:
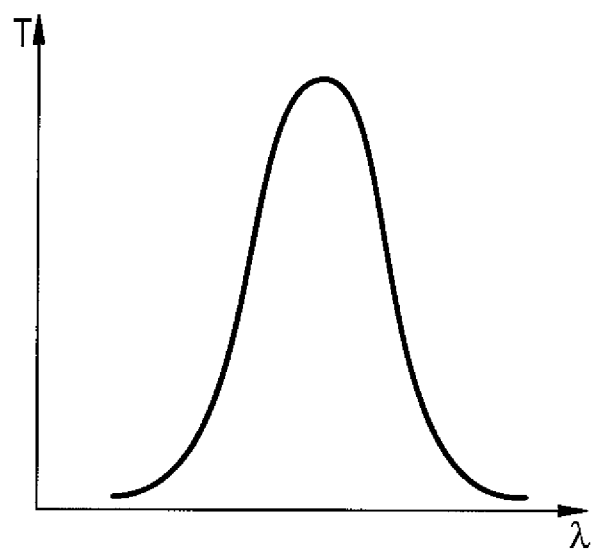
FIG. 4 is a schematic graphic representation of the transmission curve of a transmission filter.

FIG. 4 shows the transmission T of a wavelength filter, for example an etalon, as a function of the wavelength $\lambda$. The bandwidth of such a filter may amount for example to approx. 2 nm, such that a plurality of the laser modes still falls within the transmission range of the transmission filter.

To ensure that only a small number of or preferably just one longitudinal laser mode can start to oscillate, a second wavelength-selective element is therefore generally necessary.

Figure 5:
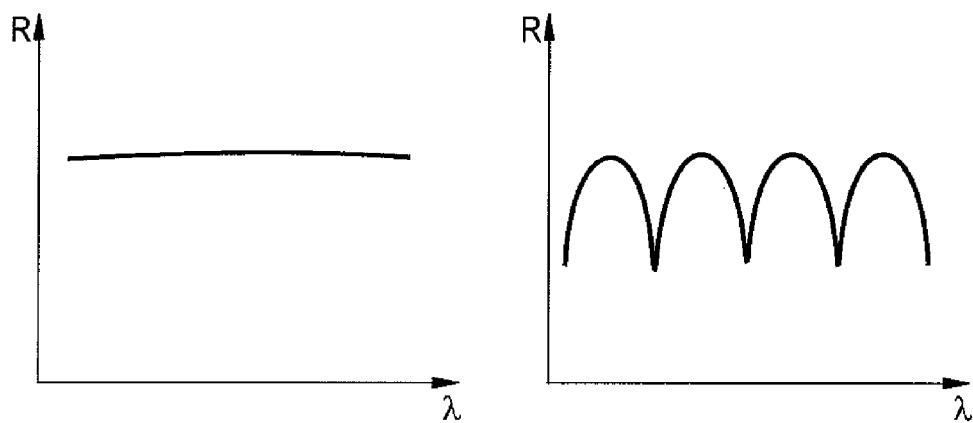
FIG. 5 shows schematic graphic representations of the reflection of a DBR mirror which do and do not take account of substrate reflections.

On the left-hand side FIG. 5 shows the reflection R of a DBR mirror in the vicinity of the reflection maximum as a function of the wavelength $\lambda$. The right-hand side shows the reflection R in the vicinity of the reflection maximum for cases in which the DBR mirror is partially transmissive and, together with a substrate comprising a reflective back, forms a cavity. In the latter case, a plurality of minima are superimposed on the reflection maximum, said minima corresponding to the resonances of the cavity. The maxima correspond to the wavelengths for which the cavity formed from the DBR mirror and the back of the substrate is antiresonant.

Figure 6:
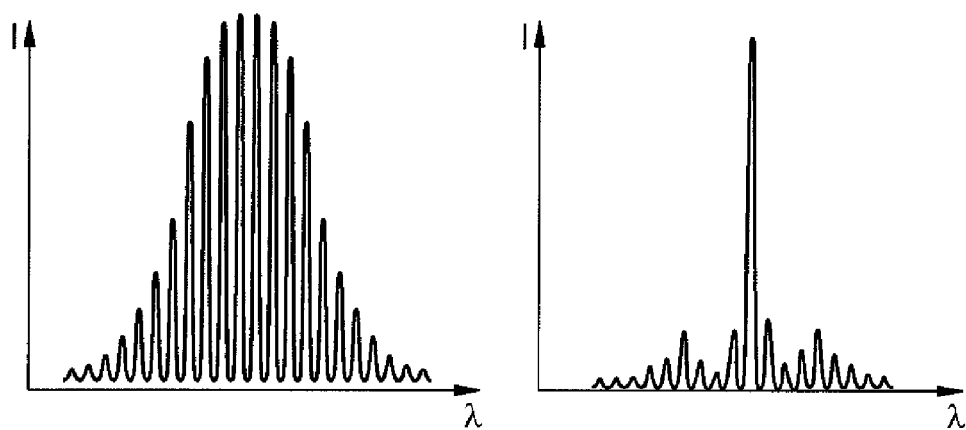
FIG. 6 shows schematic graphic representations of the emission spectrum of a surface-emitting semiconductor laser which do and do not take account of substrate reflections.

FIG. 6 clarifies how the resonance effect of the cavity may be utilised for selection of a longitudinal laser mode. The left-hand side of FIG. 6 is a schematic representation of the emission spectrum of a surface-emitting semiconductor laser, in which use is made in conventional manner of a transmission filter for spectral filtering, the transmission curve of which corresponds for example to FIG. 4, and of a conventional DBR mirror for wavelength selection, whose reflection curve is shown on the left-hand side of FIG. 5. Within the transmission maximum of the transmission filter, a plurality of longitudinal laser modes may start to oscillate, since the comparatively wide reflexion maximum of the DBR mirror does not contribute significantly to wavelength selection.

The right-hand side of FIG. 6 shows a schematic representation of the emission spectrum of an exemplary embodiment of a surface-emitting semiconductor laser according to the invention, in which wavelength selection additionally proceeds in that the DBR mirror is partially transmissive and forms a cavity together with the reflective back of a substrate. In this case, only a single longitudinal laser mode has a significant intensity, such that in this way single mode operation of the surface-emitting semiconductor laser is achieved. The longitudinal laser mode selected in this way lies in a reflection maximum of the combination of DBR mirror and the reflective back of the substrate.

FIGS. 7 and 8 show measured emission spectra of two exemplary embodiments of a surface-emitting semiconductor laser according to the invention, which are influenced as in the example shown on the right-hand side of FIG. 6 by reflections at the back of the substrate. In both cases, the substrate comprises a GaAs substrate.

The surface-emitting semiconductor lasers of the emission spectra shown in FIGS. 7 and 8 differ in the thickness of the substrate. In the exemplary embodiment shown in FIG. 7 the substrate has a thickness of 115 µm. The emission spectrum displays two emission maxima, which are spaced by 1.2 nm.

The emission spectrum shown in FIG. 8 was produced with a surface-emitting semiconductor laser comprising a substrate thickness of 80 µm. In this case the spacing of the emission maxima, which scales with the reciprocal optical thickness of the substrate, amounts to 1.8 nm.

FIG. 9 shows a simulation of a reflection spectrum of a DBR mirror on an 80 µm thick GaAs substrate, taking account of reflections at the back of the substrate. The Figure illustrates the reflectivity R of the combination of the DBR mirror and the substrate for different degrees of reflection $R_S$ of the back of the substrate, specifically for $R_S=0\%$ (curve 17), $R_S=35\%$ (curve 18), $R_S=59\%$ (curve 19) and $R_S=83\%$ (curve 20).

The simulations make it clear that in the case of a reflective back of the substrate reflection minima 21 form, which intensify with increasing reflection at the back of the substrate. The wavelengths of the reflection minima 21 correspond to the resonant wavelengths of the cavity, which is formed by the substrate arranged between the DBR mirror and the reflective back of the substrate. Reflection maxima 22 are arranged between the reflection minima 21, which maxima correspond to the wavelengths at which the cavity is antiresonant. In the case of the surface-emitting semiconductor laser according to the invention, the cavity is advantageously antiresonant, such that at the wavelength emitted by the active layer a reflection maximum 22 is present.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. A surface-emitting semiconductor laser, comprising:
   a semiconductor chip including a growth substrate comprising one of GaAs, InP, SiC and sapphire, a DBR mirror applied to the growth substrate and an epitaxial layer sequence applied to the DBR mirror, the epitaxial layer sequence comprising a radiation-emitting active layer; and an external resonator mirror arranged outside the semiconductor chip;

wherein the DBR mirror and the growth substrate are partially transmissive for radiation emitted by the radiation-emitting active layer and a back of the growth substrate remote from the DBR mirror is reflective to the emitted radiation, wherein the back of the growth substrate is provided with a reflection-increasing layer.

2. The surface-emitting semiconductor laser according to claim 1, wherein the reflection-increasing layer comprises a metal or a metal alloy.

3. The surface-emitting semiconductor laser according to claim 1, wherein the reflection of the back, provided with the reflection-increasing layer, of the growth substrate amounts to more than 30%.

4. The surface-emitting semiconductor laser according to claim 1, wherein the DBR mirror has a transmission of more than 0.1% for the radiation emitted by the radiation-emitting active layer.

5. The surface-emitting semiconductor laser according to claim 1, wherein a combination of the DBR mirror and a cavity formed with the reflective back of the growth substrate has a reflection of more than 99.9%.

6. The surface-emitting semiconductor laser according to claim 1, wherein a single etalon is positioned between the external resonator mirror and the epitaxial layer sequence.

7. The surface-emitting semiconductor laser according to claim 6, wherein the single etalon contained in the external resonator is an uncoated etalon.

8. The surface-emitting semiconductor laser according to claim 7, wherein the etalon is an uncoated glass wafer.

9. The surface-emitting semiconductor laser according to claim 1, wherein the surface-emitting semiconductor laser is an optically pumped semiconductor laser.

10. The surface-emitting semiconductor laser according to claim 9, wherein the surface-emitting semiconductor laser comprises a pump radiation source arranged outside the semiconductor chip.

11. The surface-emitting semiconductor laser according to claim 9, wherein the surface-emitting semiconductor laser comprises a pump laser integrated monolithically into the epitaxial layer sequence.

12. The surface-emitting semiconductor laser according claim 1, wherein the surface-emitting semiconductor laser comprises a frequency conversion element for frequency conversion of the emitted radiation.

13. The surface-emitting semiconductor laser according claim 1, wherein the emitted radiation is in accordance with the relationship:

$$n*d=(m+\tfrac{1}{2})*\lambda/2,$$

wherein n is a reflective index of the growth substrate, d is a thickness of the growth substrate and λ is a wavelength of the emitted radiation, and wherein m is an integer.

14. A surface-emitting semiconductor laser comprising:

a semiconductor chip including a growth substrate comprising one of GaAs, InP, SiC and sapphire, a DBR mirror applied to the growth substrate and an epitaxial layer sequence applied to the DBR mirror, the epitaxial layer sequence comprising a radiation-emitting active layer; and an external resonator mirror arranged outside the semiconductor chip;

wherein the DBR mirror and the growth substrate are partially transmissive for radiation emitted by the radiation-emitting active layer and a back of the substrate remote from the DBR mirror is reflective to the emitted radiation; wherein the back of the growth substrate is provided with a reflection-increasing layer; and wherein a cavity formed by the DBR mirror and a reflective back of the growth substrate is antiresonant at a wavelength of the radiation emitted by the radiation-emitting active layer.

* * * * *